US009232629B2

(12) United States Patent
Jingama et al.

(10) Patent No.: US 9,232,629 B2
(45) Date of Patent: Jan. 5, 2016

(54) METAL CORE BOARD FOR VEHICLE-MOUNTABLE JUNCTION BOX

(75) Inventors: Shinichi Jingama, Shiga (JP); Kengo Aburaya, Shiga (JP); Hideki Nakazato, Shiga (JP); Kazumasa Sakata, Shiga (JP); Shinya Saito, Shiga (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 236 days.

(21) Appl. No.: 13/564,503

(22) Filed: Aug. 1, 2012

(65) Prior Publication Data

US 2012/0292094 A1 Nov. 22, 2012

Related U.S. Application Data

(63) Continuation of application No. PCT/JP2011/052000, filed on Feb. 1, 2011.

(30) Foreign Application Priority Data

Feb. 1, 2010 (JP) ................... 2010-019862
Feb. 1, 2010 (JP) ................... 2010-019863
Feb. 1, 2010 (JP) ................... 2010-019864
Feb. 1, 2010 (JP) ................... 2010-019865

(51) Int. Cl.
*H05K 1/00* (2006.01)
*H05K 1/02* (2006.01)
*H05K 3/44* (2006.01)

(52) U.S. Cl.
CPC ............. *H05K 1/0203* (2013.01); *H05K 3/44* (2013.01); *H05K 2201/09972* (2013.01); *H05K 2203/0242* (2013.01); *H05K 2203/175* (2013.01)

(58) Field of Classification Search
CPC ....... H05K 1/0203; H05K 1/05; H05K 1/053; H05K 1/056; H05K 3/44; H05K 3/202; H05K 3/445; H05K 2201/09972; H05K 2201/09971; H05K 2201/0999; H05K 2203/0242; H05K 2203/175; H05K 2203/176
USPC ............ 174/262, 264, 266, 268, 72 R, 72 B, 174/71 B, 75 D, 88 R–88 S; 361/611, 624, 361/637–640, 648
See application file for complete search history.

(56) References Cited

U.S. PATENT DOCUMENTS 5,223,676 A * 6/1993 Yamamoto et al. .......... 174/250
6,548,328 B1 * 4/2003 Sakamoto et al. ........... 438/121
(Continued)

FOREIGN PATENT DOCUMENTS

| JP | 58-166795 A | 10/1983 |
| JP | 8-288606 A | 11/1996 |
| JP | 8-288660 A | 11/1996 |
| JP | 2007-128929 A | 5/2007 |

OTHER PUBLICATIONS

International Search Report issued in PCT/JP2011/052000, mailed May 10, 2011, 2 pages.

*Primary Examiner* — Hoa C Nguyen
(74) *Attorney, Agent, or Firm* — Osha Liang LLP

(57) ABSTRACT

Provided is a metal core board which has a preferable function for a vehicle-mountable junction box, specifically, is reduced in size or improved in mounting efficiency. A metal core board for a vehicle-mountable junction box, which is mountable on the vehicle-mountable junction box, wherein a core plate forming an intermediate layer of the metal core board has a plurality of slits and an island surrounded by separating connection parts present between the slits; and in the state where the island is held between insulating layers stacked on both of two surfaces of the core plate, through-bores 46 are formed at the separating connection parts to remove the separating connection parts and the island is made electrically independent from a remaining part of the core plate while being held between the insulating layers. Thus, a plurality of circuits can be formed.

16 Claims, 13 Drawing Sheets

(56) References Cited

U.S. PATENT DOCUMENTS

| | | |
|---|---|---|
| 6,706,547 B2 * | 3/2004 | Sakamoto et al. ............ 438/33 |
| 7,329,957 B2 * | 2/2008 | Sakano et al. ............... 257/778 |
| 7,420,266 B2 * | 9/2008 | Takahashi .................... 257/669 |
| 8,436,250 B2 * | 5/2013 | Takahashi et al. ............ 174/255 |
| 2002/0081905 A1 * | 6/2002 | Nakamura et al. ............ 439/621 |
| 2003/0137813 A1 * | 7/2003 | Onizuka et al. ............... 361/777 |
| 2004/0242086 A1 * | 12/2004 | Takagi ........................ 439/885 |
| 2007/0134951 A1 * | 6/2007 | Inagaki et al. ................. 439/74 |

* cited by examiner

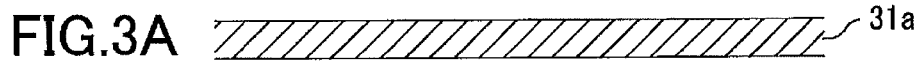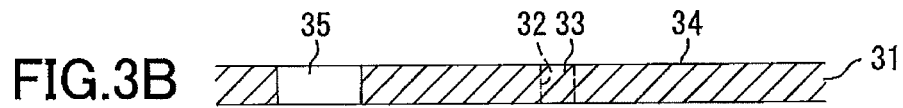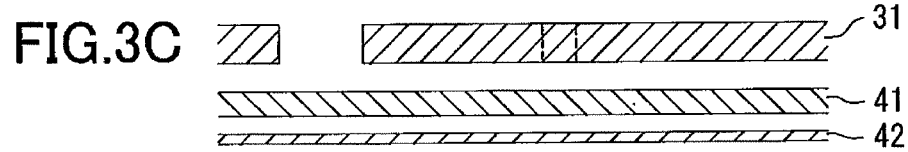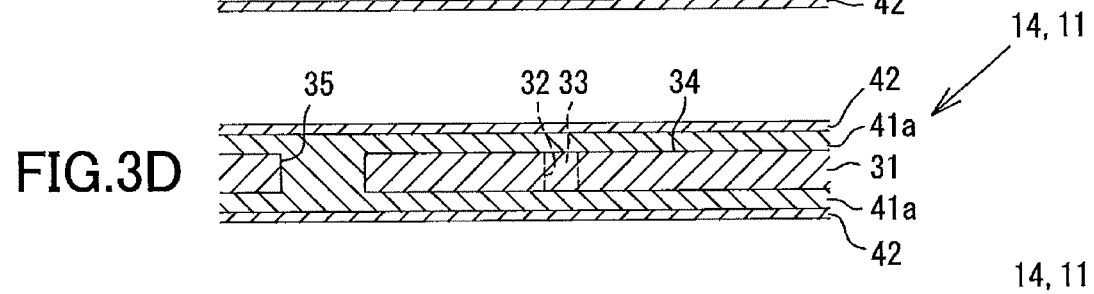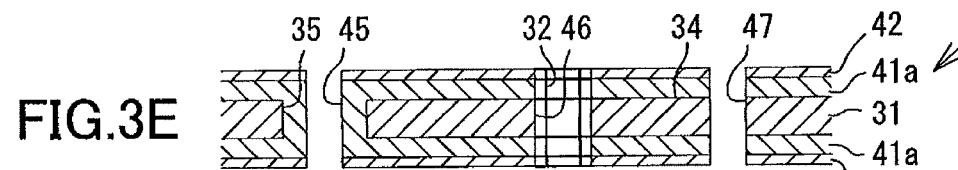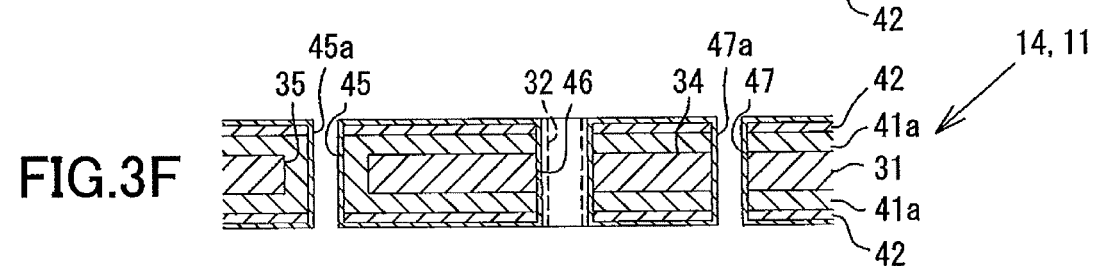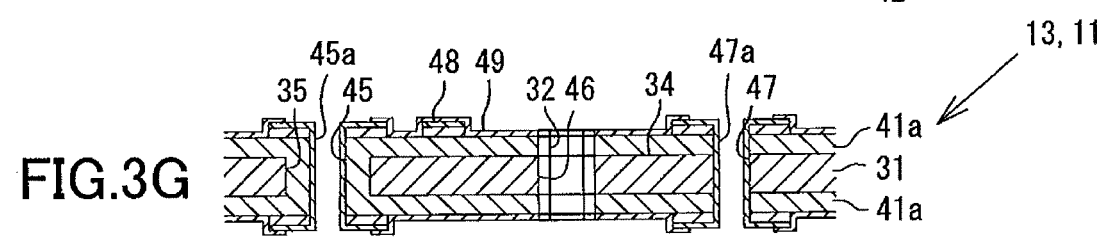

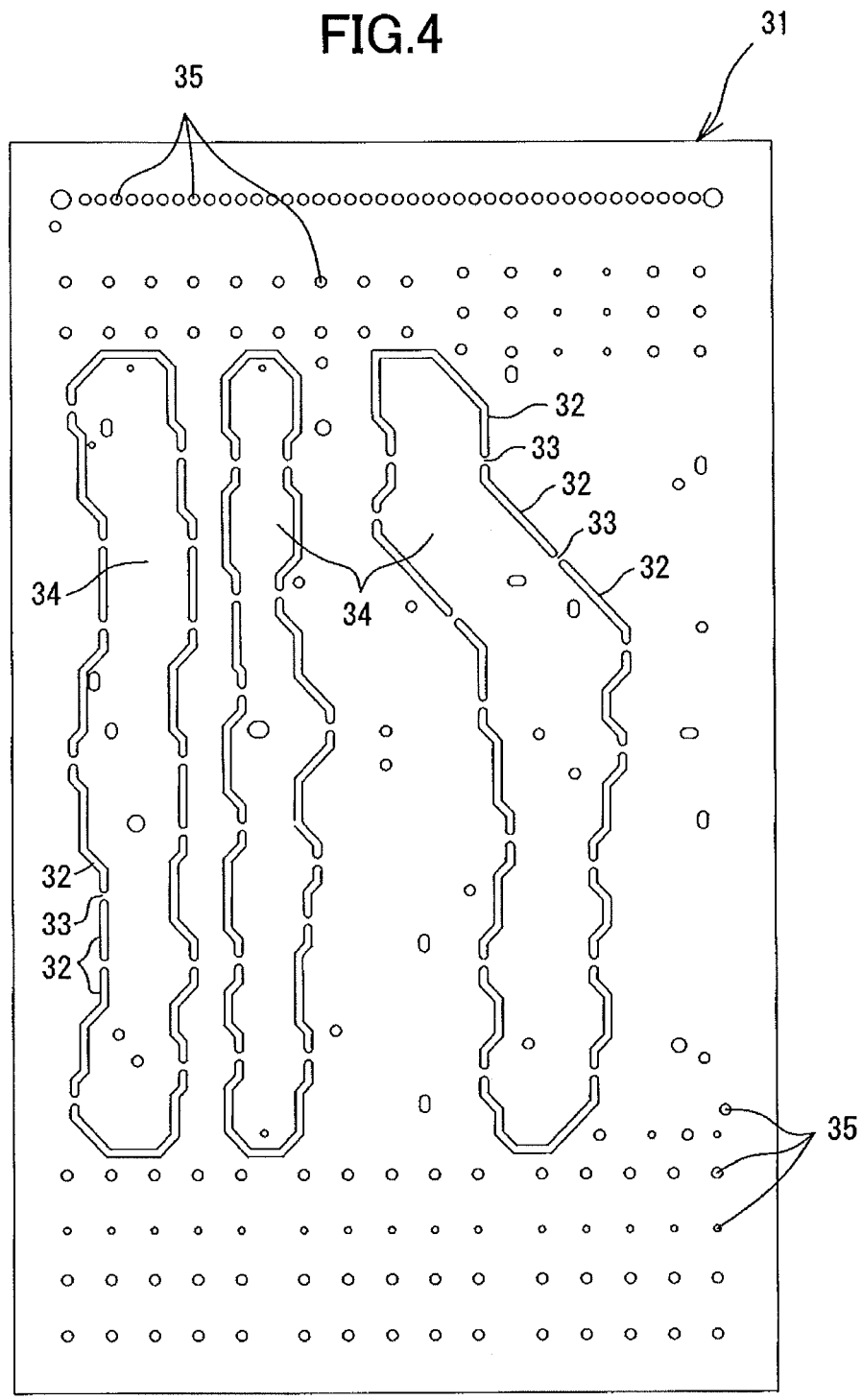

METAL CORE BOARD FOR VEHICLE-MOUNTABLE JUNCTION BOX

TECHNICAL FIELD

The present invention relates to a metal core board mountable on a vehicle-mountable junction box, and more specifically to a metal core board mountable on a vehicle-mountable junction box which has a heat radiation effect, allows a plurality of circuits to be formed thereon, and can be, for example, reduced in size and improved in mounting efficiency.

In this invention, the term "metal core board" refers to a board including a metal core plate as an intermediate layer such as, for example, an insulating board (laminate) before a wiring pattern is formed thereon, a metal core printed wiring board having a wiring pattern formed on a laminate, a metal core printed circuit board having electronic components mounted on a metal core printed wiring board or the like.

BACKGROUND ART

Conventionally, vehicle-mountable junction boxes are available in, for example, a busbar system including internal wires in the form of busbars and a printed circuit board system including internal wires in the form of a printed circuit board. Over a vehicle-mountable junction box of the busbar system, a vehicle-mountable junction box of the printed circuit board system has advantages of, for example, being more easily changed in design or the like in accordance with the type, grade or shipping destination of the vehicle and allowing a circuit pattern to be formed in a shorter period of time.

However, a printed circuit board including a board formed of general glass epoxy has a problem of being liable to be raised in temperature because heat from electronic components or the circuit patterns mounted thereon is insulated by an insulating layer and thus the heat is concentrated on the circuit patterns. In addition, because the heat generated from one of the circuits is isolated from the heat generated in another circuit on the printed circuit board, the heat cannot be collected and radiate collectively.

In order to deal with this problem, it is known to use a metal core plate such that the heat from the electronic components or the circuit patterns is uniformized by the core plate and the heat is urged to radiate from the entirety of the board.

However, merely changing the material of the board and adopting a metal core board does not reduce the size or improve the mounting efficiency sufficiently.

In the meantime, Patent Document 1 discloses a metal core board which allows a plurality of circuits to be formed thereon, although this metal core board is not for a vehicle-mountable junction box.

This metal core board is formed as follows. In order to form a quadrangular independent island in a metal core (core plate), substantially U-shaped holes are punched in the metal core while two connection parts are left unpunched. Insulating plates are stacked on both of two surfaces of the metal core. Then, bores are formed from outside to remove the connection parts. As a result of the connection parts being removed, the island becomes independent from an area surrounding the island, namely, the metal core is divided into a plurality of areas.

The punched holes have a width sufficient to block the heat transmission to the island from the surrounding area.

Therefore, there are functions and effects that a plurality of circuits are formed and also the heat transmission is blocked by the presence of the punched holes in the metal core.

However, no metal core board for a vehicle-mountable junction box has ever adopted the structure of dividing the core as disclosed in Patent Document 1.

Automobiles are desired to have more functions and a certain size of space of a compartment. Especially from the viewpoint of providing a certain size of space of a compartment, the junction box is occasionally mounted in a high-temperature engine room and thus is required to be durable. However, for the metal core board disclosed in Patent Document 1, no consideration is given to warp, stress or the like which is caused to the core plate during or after the formation of the punched holes or the formation of the bores to remove the connection parts. When the core plate is warped or stressed, the core plate is distorted after being used for a long time, which may hinder the functions of the metal core board.

Therefore, even when the technology disclosed in Patent Document 1 is merely adopted for the metal core board for a vehicle-mounted junction box, the metal core board is distorted by the warp or stress caused to the core plate and does not have a necessary level of durability.

In addition, in the case of the metal core board disclosed in Patent Document 1, the separate island is formed merely for the purpose of heat radiation.

The bores made at the connection parts in order to divide the core are left open and are not used for anything.

Since the bores are left open, there is the following inconveniences. When, for example, soldering of a flow system is conducted in order to secure the electronic components mounted on the metal core board, the solder sprouts from the bores and adheres to areas where the solder should not adhere.

In addition, end surfaces of the metal core are exposed to an inner circumferential wall of each bore. This may undesirably cause core-to-core leaks when the plurality of circuits are used.

The punched holes formed in the metal core of Patent Document 1 are for blocking the heat transmission and so are wide.

Therefore, heat generated in one circuit is isolated from heat generated in another circuit. Namely, the heat does not radiate as being dispersed and uniformized in the entire metal core board, and therefore a local temperature rise cannot be suppressed. Accordingly, even when the technology disclosed in Patent Document 1 is merely adopted for the metal core board for a vehicle-mounted junction box, a necessary level of heat radiation effect is not provided.

Since the punched holes are wide, it cannot be expected to reduce the size or improve the mounting efficiency.

However, as the punched holes are narrower, or as the straight portions of the punched holes are longer, the punched holes act more like bent lines. As a result, the metal core is more liable to be warped or stressed. When the metal core is warped or stressed, the metal core is distorted after being used for a long time, which may hinder the functions of the metal core board.

The metal core is liable to be warped or stressed when being handled and also when being processed. A punched hole may be formed by use of a rooter, etching, drilling, punching by use of a die or the like. Punching by use of a die is most appropriate from the viewpoint of ease of work because punching can make a hole in one step of action. However, in the case of punching a hole by use of a die, as the resultant hole is thinner and longer, the core plate is more liable to be warped or stressed.

In addition, for punching a thin hole, the die needs to be have a thin blade. Such a blade may occasionally be stuck between a die block and a stripper, may fall down or may be bent, at the time of punching. This significantly wears or damages the die, and shortens the life of the die. As can be seen, there are inconveniences that, for example, the work is difficult, the working efficiency is low, and the cost is high.

CITATION LIST

Patent Literature

Patent Document 1: Japanese Laid-Open Patent Publication No. Hei 8-288606

SUMMARY OF INVENTION

Technical Problem

The present invention has a main object of providing a metal core board for a vehicle-mountable junction box which can be, for example, reduced in size and improved in mounting efficiency, and especially can provide a high level of durability and a high level of heat radiation property.

Solution To Problem

Main means for solving the above-described problem is provided by a metal core board for a vehicle-mountable junction box, which is mountable on the vehicle-mountable junction box, wherein a core plate forming an intermediate layer of the metal core board has an island surrounded by a plurality of slits and separating connection parts present between the slits; and in the state where the island is held between insulating layers stacked on both of two surfaces of the core plate, the separating connection parts are removed and the island is made electrically independent from a remaining part of the core plate while being held between the insulating layers.

Another main means is provided by a core plate structure usable for a metal core board for a vehicle-mountable junction box, which is mountable on the vehicle-mountable junction box. The metal core structure includes an island surrounded by a plurality of slits and separating connection parts present between the slits.

Advantageous Effects of Invention

According to the present invention, the core plate has an electrically independent island. Therefore, a metal core board which can be, for example, reduced in size and improved in mounting efficiency and thus is optimum for a vehicle-mountable junction box is provided.

BRIEF DESCRIPTION OF DRAWINGS

FIG. 3 provides schematic views showing production steps of the metal core board.

FIG. 4 is a plan view showing an example of core plate.

DESCRIPTION OF EMBODIMENTS

Hereinafter, an embodiment of the present invention will be described with reference to the drawings.

Figure 1A:
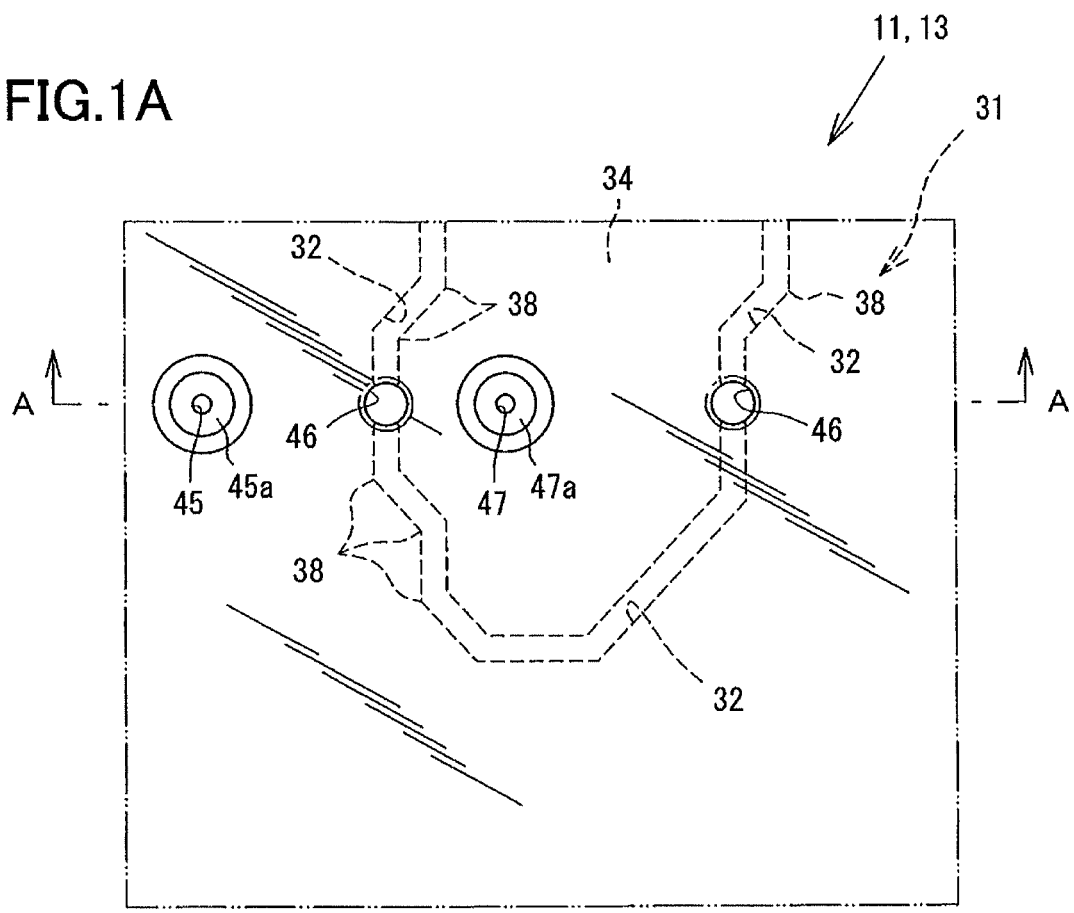
FIG. 1 provides a plan view and a cross-sectional view showing a schematic structure of a metal core board.
Figure 1B:
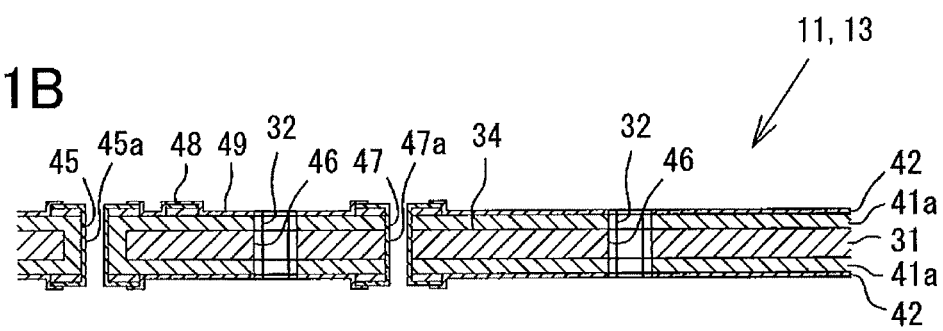

FIG. 1 shows a schematic structure of a metal core board 11 for a vehicle-mountable junction box. FIG. 1A is a plan view showing a part of the metal core board 11, and FIG. 1B is a cross-sectional view taken along line A-A in FIG. 1A. In FIG. 1A, circuit patterns are omitted for the sake of convenience.

Figure 2:
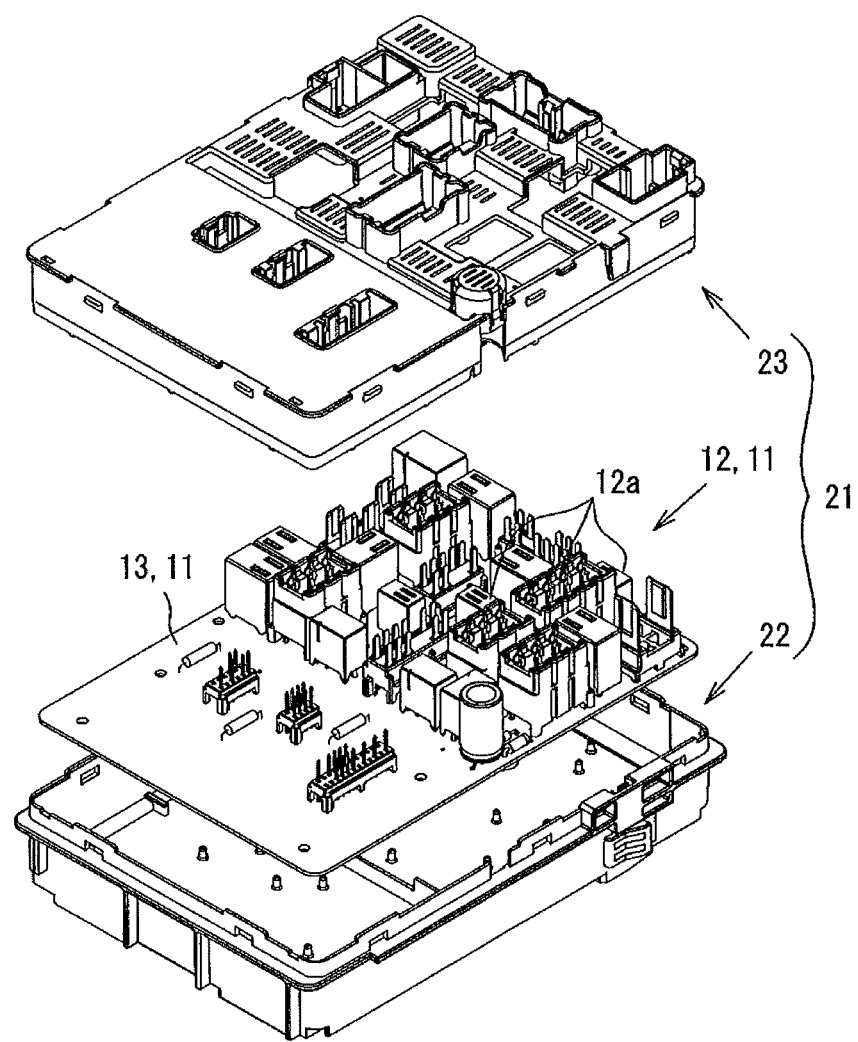
FIG. 2 is an exploded isometric view of a vehicle-mountable junction box.

The metal core board 11 is mountable on, for example, a vehicle-mountable junction box 21 as shown in, for example, FIG. 2. In a core plate 31 forming an intermediate layer of the metal core board 11, islands 34 surrounded by a plurality of slits 32 and separating connection parts 33 present between the slits 32 are formed (see FIG. 4). In the state where the islands 34 are held between insulating layers 41 stacked on both of two surfaces of the core plate 31, the separating connection parts 33 are removed. As a result, the islands 34 are electrically independent from a remaining part of the core plate 31 while being held between the insulating layers 41.

Namely, the core plate 31 before the islands 34 become independent has a core plate 31 structure including the islands 34 surrounded by the plurality of slits 32 and the separating connection parts 33 present between the slits 32.

After the separating connection parts 33 are removed from the metal core board 11, there are through-bores 46. In each of the through-bores 46, a contact part 61 is held in contact with end surfaces of the core plate 31 exposed to an inner circumferential wall of the through-bore 46 (see FIG. 13).

In FIG. 2, reference sign 12 represents a metal core board (metal core printed circuit board) including mounted electronic components 12a, and reference sign 13 represents a metal core board (metal core printed wiring board) excluding the electronic components 12a. Reference sign 22 represents a lower case, and reference sign 23 represents an upper case.

The metal core board 11 as the metal core printed wiring board 13 is produced by steps shown in FIG. 3. First, the steps will be described in general, and then the core plate 31 and the like will be described in detail.

First, a metal plate having a prescribed thickness (for example, copper plate, aluminum plate) to be used as the core plate 31 is cut to obtain a material plate 31a (see FIG. 3A).

Then, at prescribed positions of the material plate 31a, desired bores 35 and slits 32 are made to form the core plate 31 (see FIG. 3B). FIG. 4 is a plan view showing an example of the core plate 31.

Next, surfaces of the core plate 31 are roughened in order to improve the adhesiveness of a resin.

Then, on each of the two roughened surfaces of the core plate 31, a prepreg 41 and a copper foil 42 are stacked sequentially (see FIG. 3C). The resultant core plate 31 is sandwiched between stainless steel plates (not shown) and heat-pressed to obtain an integral laminate (see FIG. 3D). During the integration step, the bores 35 and the slits 32 are filled with the resin of the prepreg 41.

As a result of the formation of the integral laminate, the copper foil 42 is present on each of the two surfaces of the core plate 31, with an insulating layer 41a formed of the prepreg 41 being interposed between the copper foil 42 and the core plate 31. The integral laminate is a copper-clad laminate 14.

Next, at prescribed positions at which through-holes are to be formed, through-bores 45 and 47 are formed, and at the positions of the separating connection parts 33 between the slits 32, through-bores 46 are formed (see FIG. 3E). By the through-bores 46 formed at the positions of the separating connection parts 33, the islands 34 of the core plate 31 are each separated from a surrounding area and become electrically independent. Thus, the metal core board 11 in which the core plate 31 is divided is obtained.

The formation of the through-bores 46 for dividing the core plate 31 may be performed at any stage after the integral laminate is formed.

Next, for forming the through-holes, the through-bores 45 and 47 are subjected to necessary processing such as desmearing or the like and then plated. Conductive parts are formed on an inner circumferential wall of each of the through-bores 45 and 47 and the vicinity thereof (see FIG. 3F). The through-bores 45 are plated with a well-known through-bore plating material 45a, and the through-bore plating material 45a and the core plate 31 are not in contact with each other. A plating layer 47a provided on the inner circumferential wall of each of the through-bores 47 is electrically in contact with the core plate 31. The plating layer 47a is a conductive part provided for using the core plate 31 as a part of a circuit. A terminal (not shown) is inserted into each of the through-bores 47 and connected therewith by soldering.

Then, necessary processing such as formation of a circuit pattern 48, formation of a solder resist 49 and the like is performed. As a result, the metal core board 11 as the metal core printed wiring board 13 is obtained (see FIG. 3G).

Now, a structure of the core plate 31 for producing the metal core board 11 as described above will be described. The core plate 31 is structured so as to be reduced in size, to be improved in mounting efficiency, to be improved in heat radiation effect owing to heat uniformization, and so as not to be warped or stressed.

As shown in FIG. 4 as an example, the plurality of slits 32 are formed in a closed loop shape in the core plate 31 in an inner area in a planar direction thereof. By the formation of the slits 32, the separating connection parts 33 and the islands 34 are formed. In other words, by forming the slits 32 intermittently in a closed loop shape, the separating connection parts 33 and the islands 34 are formed.

The slits 32 may be formed by use of a rooter, etching, drilling, punching by use of a die or the like which are all well known, Among these techniques, punching by use of a die, which forms a slit 32 in one step of action, is superb in terms of the production efficiency and the size precision. Therefore, an example of forming the slits 32 by punching by use of a die will be described.

Figure 5:
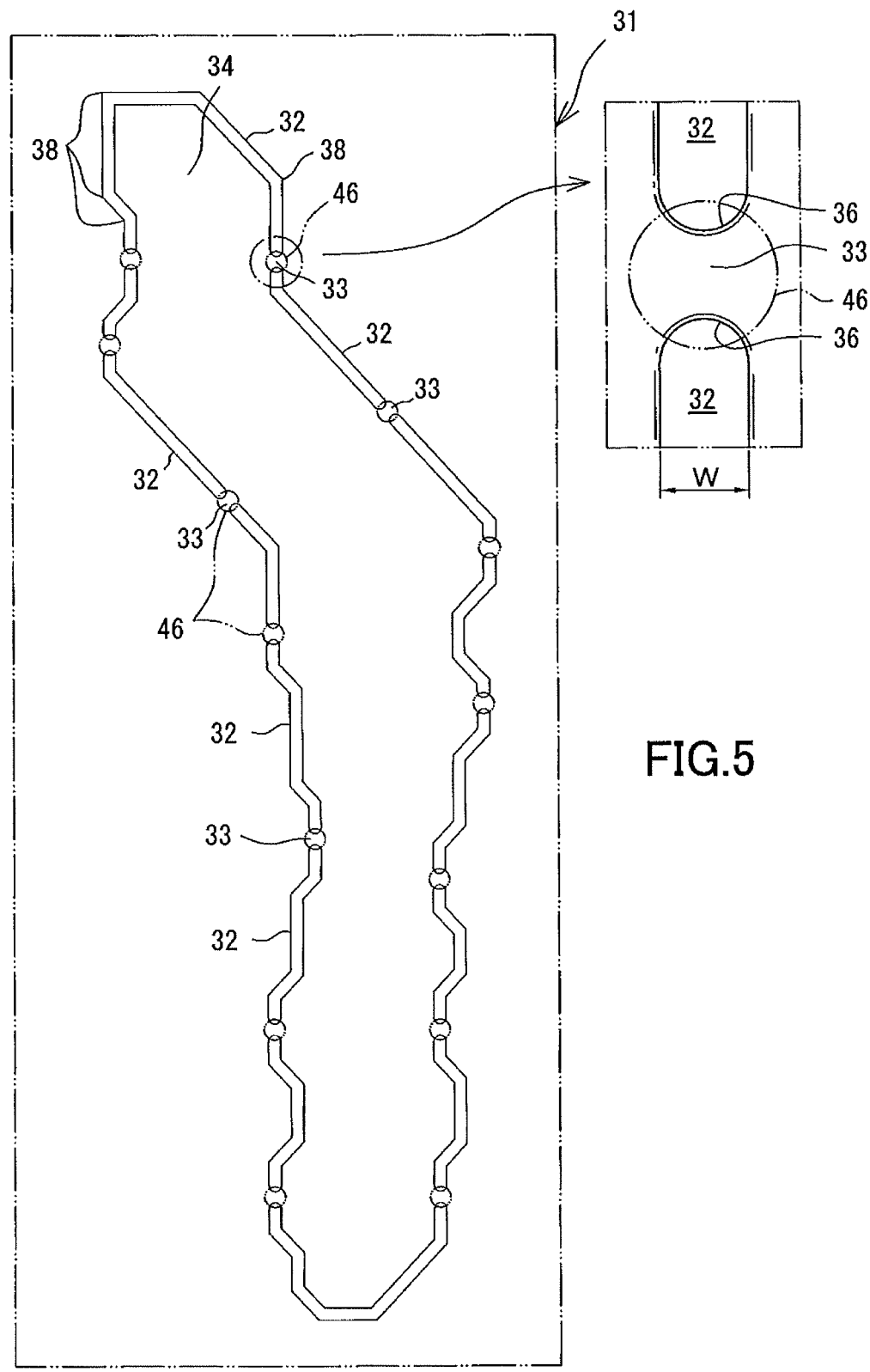
FIG. 5 is a partial enlarged view of FIG. 4.

Each separating connection part 33 is formed to have a size with which areas sandwiching the corresponding slits 32 are separated from each other when one through-bore 46 is formed at the position of the separating connection part 33. FIG. 5 shows, in enlargement, one of the plurality of islands 34 shown in FIG. 4. As shown in FIG. 5, once the through-bores 46 represented by the phantom lines are made in areas between the slits 32, namely, at the separating connection parts 33, the island 34 of the core plate 31 is separated from the surrounding area.

Figure 6A:
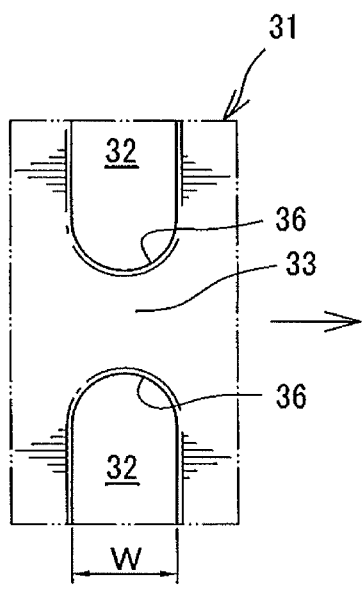
FIG. 6 provides plan views showing how an area including a separating connection part of the core plate and the vicinity thereof is changed during the production steps.
Figure 6B:
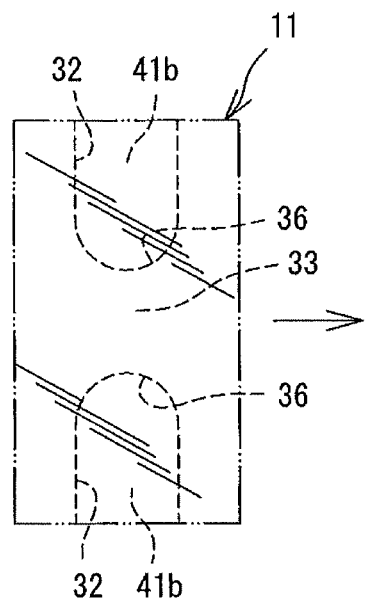
Figure 6C:
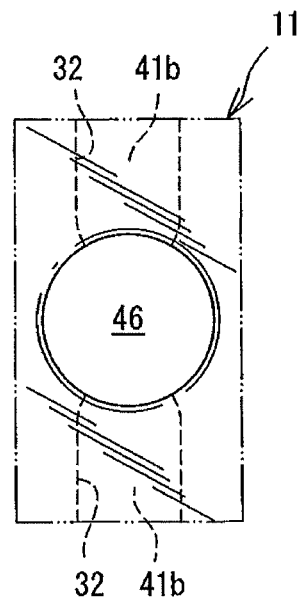

FIG. 6 shows plan views of the separating connection part 33 and ends of the slits 32 in the order of the production steps. On each of the two surfaces of the core plate 31 shown in FIG. 6A, the prepreg 41 and the copper foil 42 are stacked to form the copper-clad laminate 14 (see FIG. 3D). At this point, as shown in FIG. 6B, the slits 32 are filled with a resin 41b. When the through-bore 46 is made as shown in FIG. 6C, the areas facing each other while sandwiching the slits 32 in the core plate 31 are separated from each other.

The slits 32 are set to have a narrow width W in order to reduce the size, to improve the mounting efficiency, to improve the heat radiation effect owing to heat uniformization, and to provide a certain level of flowability of the resin in the stacking steps (see FIGS. 3C and 3D). The "narrow width W" means a width which is narrow in consideration of the conditions of the thickness of the core plate 31, the length of the slits 32 and the like. Specifically, the slits 32 are set to have a width with which the heat transmission between the areas facing each other while sandwiching the slits 32 is permitted even when the slits 32 are filled with the resin 41b.

The narrow width W is determined in consideration of the flowability of the resin, and is preferably as narrow as possible. For example, when the thickness of the core plate 31 is 0.4 mm, the narrow width W is about 1 mm to 2 mm and preferably is about 1.5 mm.

When the through-bores 46 for dividing the core plate 31 are large, an area of the metal core board 11 which is usable for forming circuits is made smaller. This prevents the size reduction or the improvement of the mounting efficiency. Therefore, the size (width) of the separating connection parts 33 is also set to be as small as, for example, about 1 mm to 2 mm.

Since the slits 32 are narrow and the separating connection parts 33 are small, the core plate 31 is liable to be warped or stressed during or after the formation of the slits 32 or the through-bores 46. Therefore, as shown in the partially enlarged part of FIG. 5, the slits 32 for forming the separating connection parts 33 each have an arcked portion 36 at each of ends thereof.

The arcked portion 36 may be provided in a part of each end of each slit 32, but it is preferable that the arcked portion 36 is formed to be semicircular as seen in a plan view and provided such that entirety of each end of each slit 32 is the arcked portion 36 as shown in the figure.

Where the ends of the slits 32 have such an arcked portion 36, when the through-bore 46 as shown in FIG. 6C is made by drilling, stress concentration on one area is prevented better than in the case where the ends of the slits 32 are squared. Namely, stress concentration can be alleviated and thus the core plate 31 or the insulating layers 41a can be prevented from being distorted.

In addition, the life of the die used to punch the slits 32 is extended as compared with the case where the ends of the slits 32 are squared. This results in cost reduction.

Where the ends of the slits 32 have the arcked portion 36, even when the separating connection part 33 is small, the core plate 31 is stronger because stress concentration is alleviated as compared with the case where the ends of the slits 32 are squared. Therefore, the core plate 31 is easier to handle in the stacking steps (see FIGS. 3C and 3D).

Figure 7A:
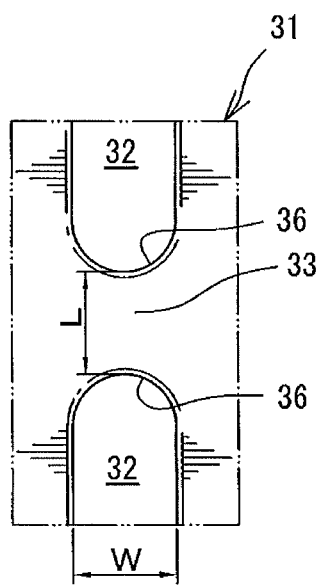
FIG. 7 provides plan views each showing a separating connection part of the core plate and the vicinity thereof.
Figure 7B:
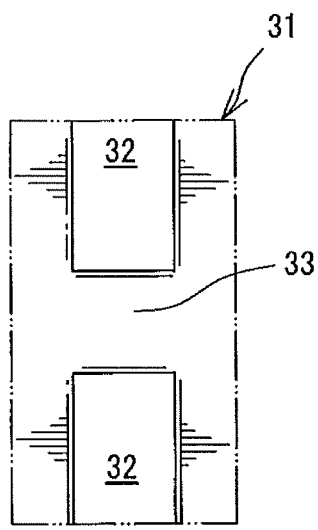
Figure 7C:
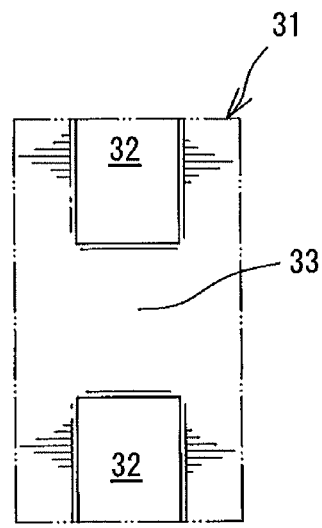

Namely, when the ends of the slits 32 are squared as shown in FIGS. 7B and 7C, especially when the separating connection part 33 is small as shown in FIG. 7B, an excessive load is applied on the separating connection part 33 and the vicinity thereof. Therefore, the form of the core plate 31 is not stabilized and the core plate 31 is not easy to handle. Hence, as shown in FIG. 7C, the separating connection part 33 needs to be enlarged. By contrast, when the ends of the slits 32 have the arcked portion 36, as shown in FIG. 7A, a distance L between the slits 32 can be short. Namely, the separating connection part 33 can be small.

As a result, the size of the through-bore 46 to be formed can be made significantly small. When the through-bore 46 is small, a usable area of the metal core board 11 is made large, which contributes to the size reduction and the improvement of the mounting efficiency of the metal core board 11. During the soldering performed in a flow system after the electronic components 12a (see FIG. 2) are mounted, the solder can be significantly prevented from spouting from the through-bore 46 because the through-bore 46 is small.

Even though the through-bore 46 is small, the core plate 31 exposed to the through-bore 46 in a following production step is etched and has the end surfaces thereof scraped. Therefore, the insulating distance (creepage distance) can be made long.

Figure 8A:
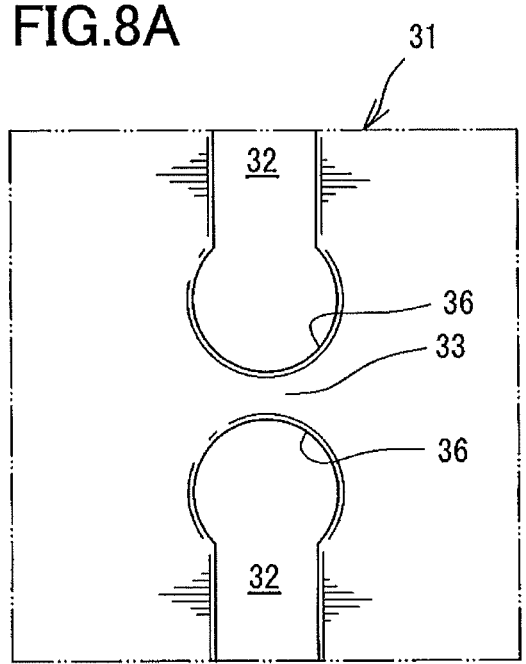
FIG. 8 provides plan views each showing a separating connection part of the core plate and the vicinity thereof in other examples.
Figure 8B:
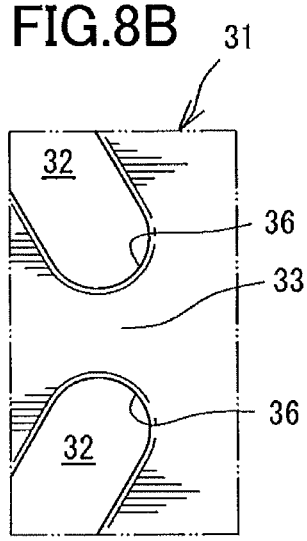

As shown in, for example, FIG. 8A, the arcked portion 36 at the end of each slit 32 may be a part of a circle having a diameter longer than the width of the slit 32. Namely, the diameter of the arcked portion 36 which is generally circular is set to be larger than the width of the slit 32. Alternatively, as shown in FIG. 8B, the slits 32 for forming the separating connection part 32 may be adjacent to each other at an appropriate angle, instead of being on a straight line.

Figure 8C:
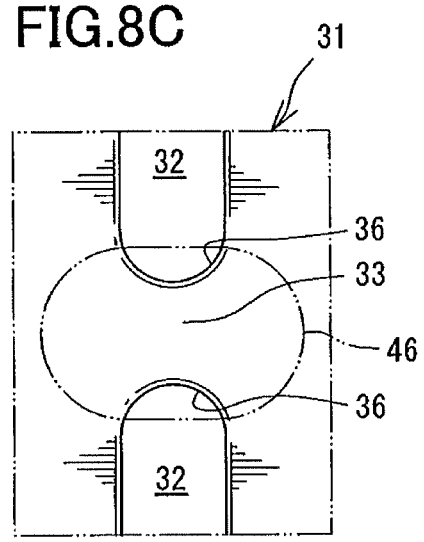

Still alternatively, as shown in FIG. 8C, the through-bore 46 for dividing the core plate 31 may be elliptical. This is preferable because even when the position of the through-bore 46 is shifted, the core plate 31 can be divided with certainty.

Figure 9A:
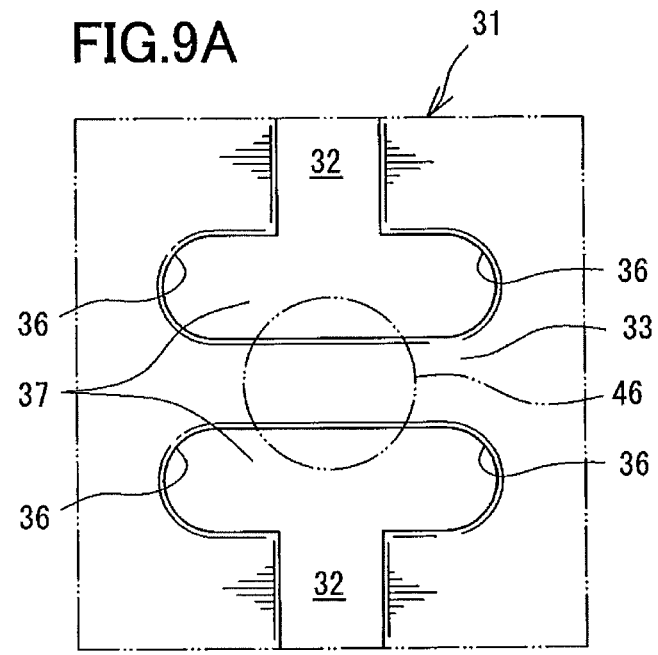
FIG. 9 provides plan views each showing a separating connection part of the core plate and the vicinity thereof in other examples.

In order to obtain a necessary creepage distance with certainty even when the position of the through-bore 46 for dividing the core plate 31 is shifted, it is preferable that the separating connection part 33 is sandwiched between lengthy holes 37 which are wider than main parts of the slits 32. Namely, as shown in FIG. 9A, the ends of the slits 32 may be formed to be T-shaped as seen in a plan view. The slits 32 each have the lengthy hole 37, at each end thereof, which extends in a direction perpendicular to a longitudinal direction of the slit 32. The lengthy hole 37 has an arcked portion 36 at each of ends thereof.

Where the separating connection part 33 is sandwiched between the slits 32 having such a shape, even when the position of the through-bore 46 formed by drilling is shifted in a longitudinal direction of the lengthy holes 37 (left-right direction in the figure), the through-bore 46 of a prescribed size can be formed at the separating connection part 33 with certainty. Therefore, a necessary creepage distance can be obtained.

Figure 9B:
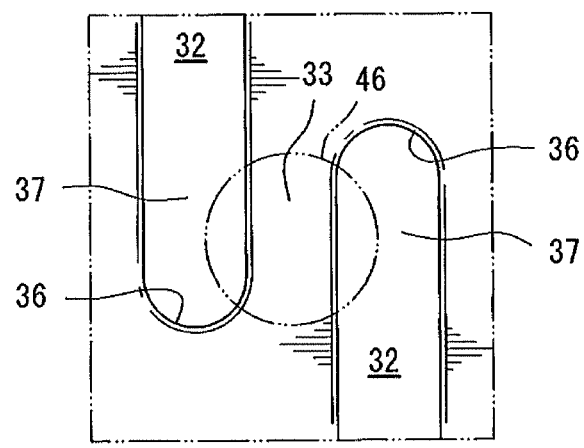

Alternatively, as shown in FIG. 9B, the ends of the slits 32 extending in the same direction in a straight line may be arranged parallel to each other to form the separating connection part 33. With such a connection part 33 also, even when the position of the through-bore 46 is shifted in the longitudinal direction of the lengthy holes 37 (up-down direction in the figure), the through-bore 46 of a prescribed size can be formed at the separating connection part 33 with certainty. Therefore, a necessary creepage distance can be obtained.

In addition, in this structure of the slits 32 and the separating connection part 33, the lengthy holes 37 allow the separating connection part 33 and the vicinity thereof to be deformed easily and thus cause a stress to escape. Therefore, during the formation of the through-bore 46 by drilling, generation of a stress can be alleviated.

Figure 10A:
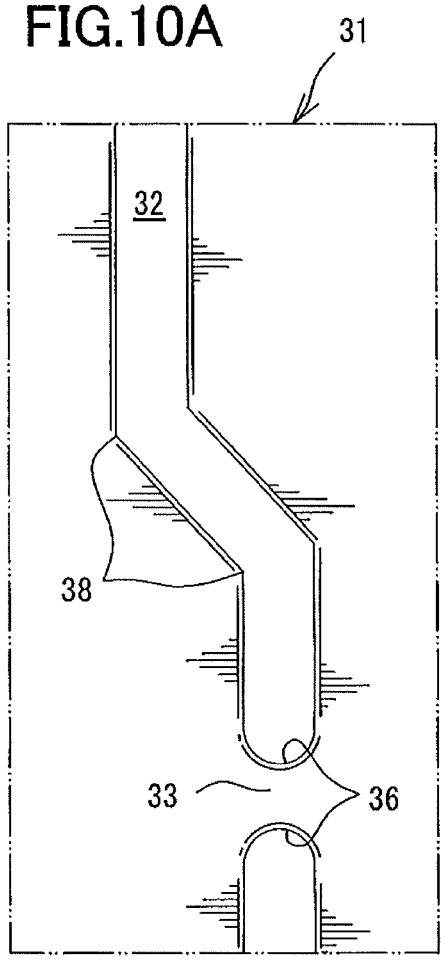
FIG. 10 provides enlarged plan views each showing a slit.

As shown in FIG. 5 and FIG. 10A, the slit 32 having the narrow width W has a bending portion 38 between the ends thereof (in an intermediate part in the longitudinal direction of the slit 32). The bending portion 38 changes the direction in which the slit 32 extends. In other words, the slit 32 as seen in a plan view includes the bending portion 38 which makes the slit 32 non-straight. Such a shape of the slit 32 strengthens a binding force of the core plate 31 when the slit 32 is punched by use of a die. The bending portion 38 may be arcked, wave-shaped, or as shown in FIG. 10A, bent at an appropriate angle. In this case, the bending portion 38 is preferably bent at an obtuse angle (tangential directions of the slit 32 at the bending portion 38 cross each other at an obtuse angle).

When the slit 32 extends in a straight line, as the slit 32 is longer, the core plate 31 tends to be warped to have a V-shaped cross-section along the slit 32 during the formation of the slit 32 by use of a die. This occurs because the long slit 32 acts as a folding line. In addition, the binding force of the material of the core plate 31 is weakened along the straight portion and thus slip of the material of the core plate 31 is promoted. This also is liable to warp the core plate 31. By contrast, when the slit 32 includes the bending portion 38 as shown in FIG. 10A or the like, the planar rigidity of the areas facing each other while sandwiching the slit 32 is increased, and therefore the warp can be suppressed. In other words, a plurality of warps in different directions tend to be caused by the slit 32 punched by use of a die and thus the force is dispersed, and as a result, a large warp can be suppressed as a whole.

When the slit 32 is long in a straight line, the core plate 31 is liable to be bent to have a V-shaped cross-section along the slit 32 and thus is liable to be warped even after the slit 32 is formed. This makes the core plate 31 difficult to handle. However, when the slit 32 includes the bending portion 38, the planar rigidity of the core plate 31 is increased and thus is suppressed from being warped as described above. As a result, the core plate 31 is easy to handle. One slit 32 may include a plurality of bending portions 38. In this case, the planar rigidity of the core plate 31 is further increased, and also the straight portion of the slit 32 can be made shorter to suppress the core plate 31 from being warped or stressed. In the case where the plurality of bending portions 38 are bent in various directions to form, for example, a zigzag shape, the core plate 31 can be further suppressed from being warped or stressed.

Figure 10B:
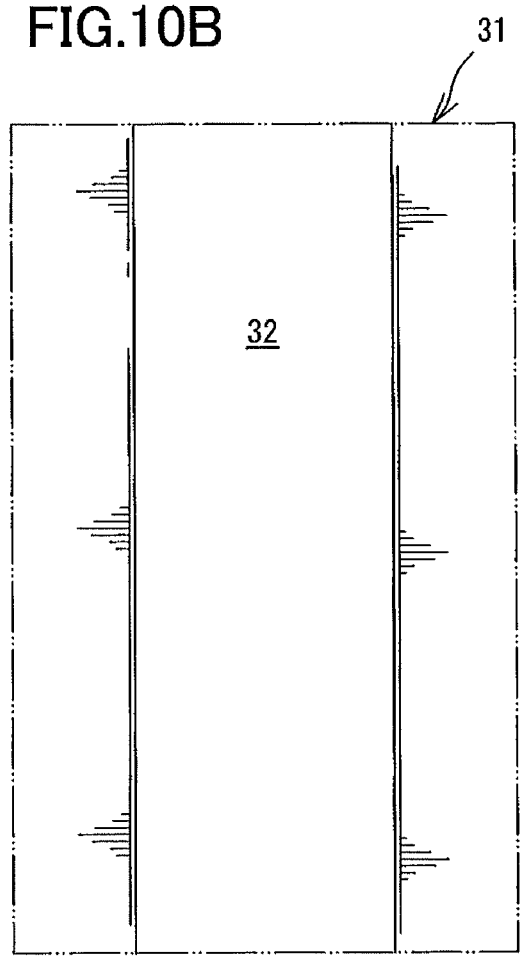

As described above, the slit 32 is preferably formed by punching by use of a die. In the case where as shown in FIG. 10B, the slit 32 is wider (wider than the slit 32 shown in FIG. 10A), the slit 32 can be punched relatively easily. However, the slit 32 having the narrow width W as described above, the core plate 31 is liable to be warped in general at the time of punching and the material of the core plate 31 is liable to cause slip in the long straight portion. By contrast, when the slit 32 includes the bending portion 38, the core plate 31 is advantageously suppressed from being warped or slipped.

Figure 11A:
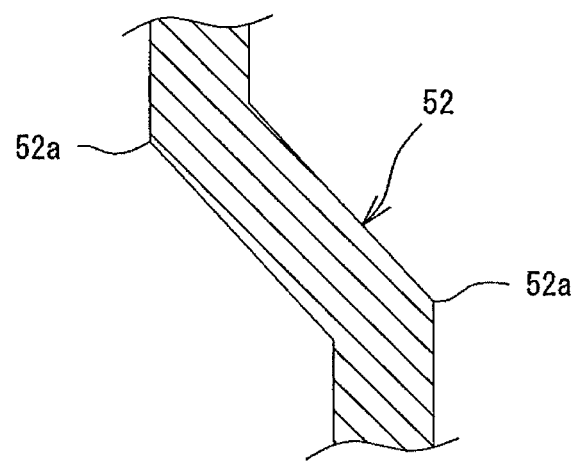
FIG. 11 provides cross-sectional views of a die used for punching a slit.
Figure 11B:
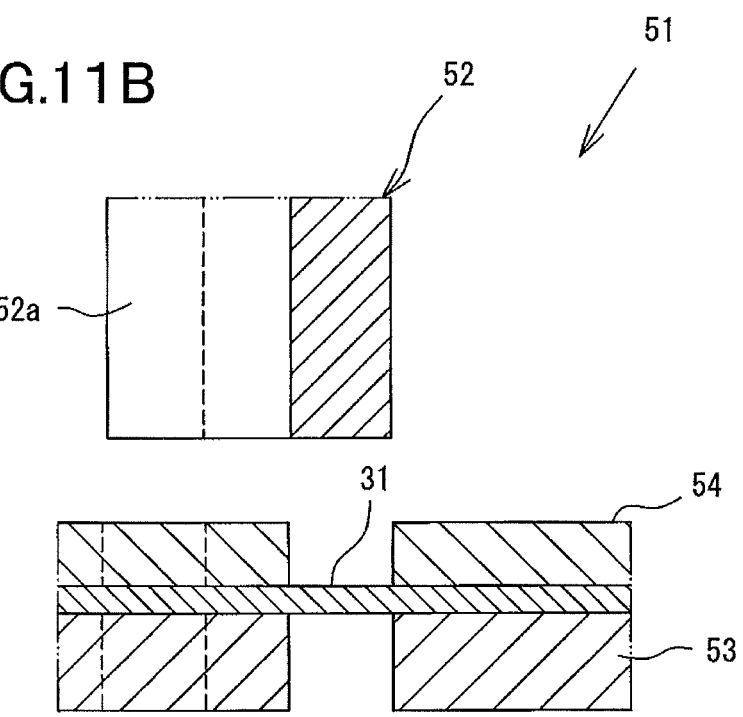

Regarding a die 51 (see FIG. 11) used for forming the slit 32, as the slit 32 is narrower, a blade 52 which is thinner is needed for punching. Such a thin blade 52 is needed has a problem of being easily damaged and thus having poor durability. FIG. 11A is a transverse cross-sectional view of the blade 52, and FIG. 11B is a vertical cross-sectional view of the die 51. In the case where the slit 32 includes the bending portion 38, as shown in FIG. 11, the blade 52 is thin but includes a bending portion 52a corresponding to the bending portion 38 of the slit 32. Therefore, the rigidity of the blade 52 is high. A restraining force of a stripper 54 on the core plate 31 can be increased. Owing to these, the blade 52 is suppressed from being stuck between a die block 53 and the stripper 54, falling down, or being bent during the punching work. Thus, the die 51 is suppressed from being worn or damaged, which improves the ease of work. In this manner, the bending portion 38 provides favorable effects on the die 51 used for punching.

The slits 32, the separating connection parts 33, and the bending portions 38 of the slits 32 are appropriately formed in accordance with the desired positions, sizes or the like of the islands 34. These elements are formed so as to improve the electrical current density in consideration of the surface roughening processing.

For forming the slits 32, the separating connection parts 33, and the bending portions 38 of the slits 32, the number, locations, size and the like of these elements, especially of the separating connection parts 33, are set in order to make the core plate 31 sufficiently strong to be handled easily. The locations of these elements are determined so as to alleviate the stress as much as possible.

The integral laminate including the core plate 31 having the above-described structure and containing a resin is formed as described above, and then the through-bores 46 are formed at the positions of the separating connection parts 33 of the core plate 31 to divide the core plate 31.

Figure 12:
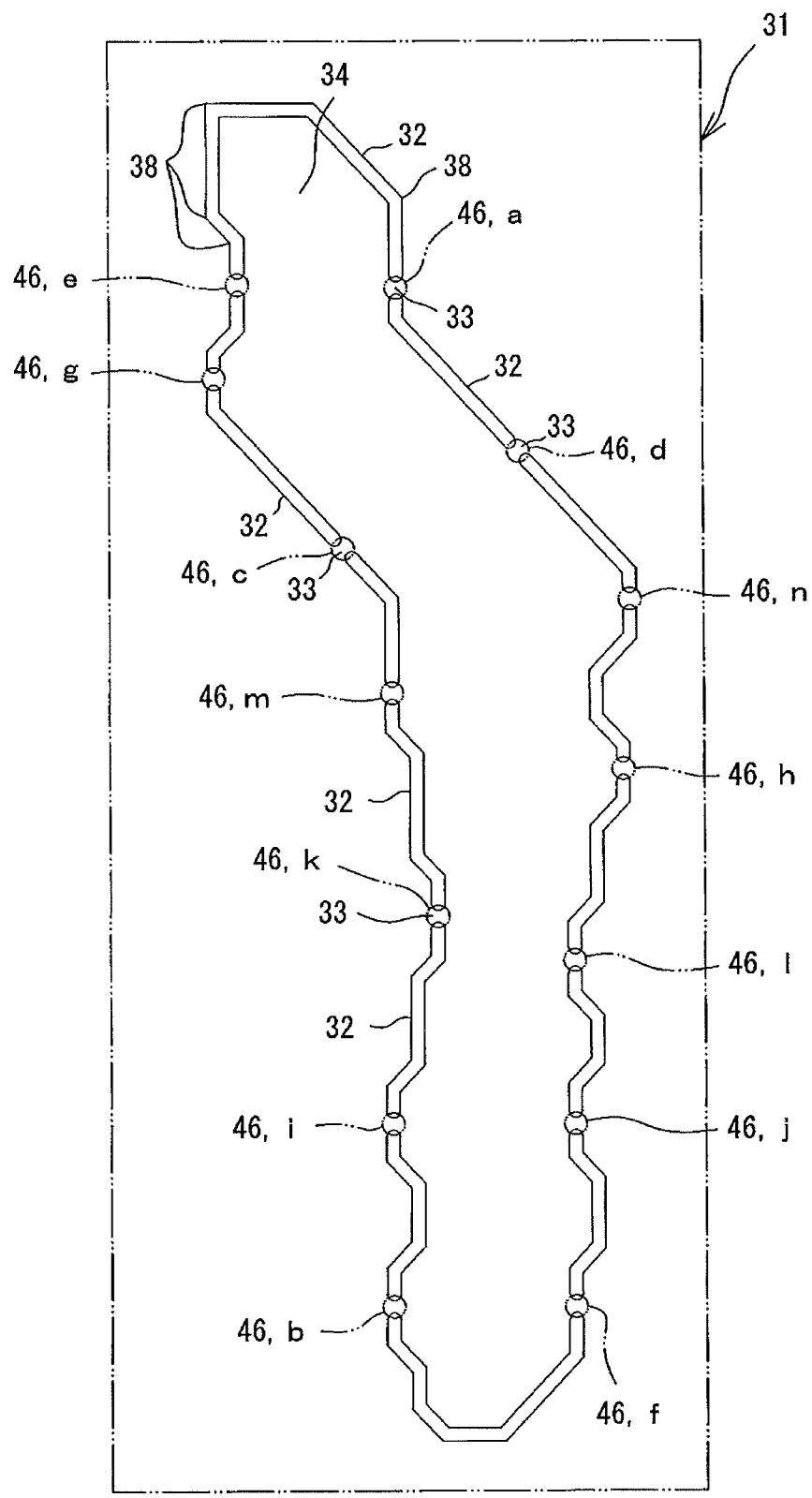
FIG. 12 shows an order of forming through-bores for dividing the core plate.

The formation of the through-bores 46 to remove the separating connection parts 33 and thus to divide the core plate 31 is performed sequentially in accordance with the shapes of the slits 32 and the separating connection parts 33 and the locations of the separating connection parts 33. For example, a through-bore 46 is first formed in an area easily deformable, and then another through-bore 46 is formed in an area which is far from the first-formed through-bore 46 and is easily deformable. In the case of the metal core board 11 including the core plate 31 having the slits 32 and the separating connection parts 33 as shown in FIG. 12, the through-bores 46 may be formed in the order of, for example, a through n to remove the separating connection parts 33.

In this manner, the stress generated during the formation of the through-bores 46 for dividing the core plate 31 can be suppressed significantly. As a result, the core plate 31 can be suppressed from being distorted and can be made durable against long-term use.

The through-bores 46 for dividing the core plate 31 do not need to be formed at all the separating connection parts 33. The through-bores 46 may be formed based on a determination made on whether or not to form the through-bores 46 in accordance with the type, grade or shipping destination of the vehicle. In accordance with the manner of forming the through-bores 46, the circuit pattern can be changed. Based on the external appearance of the metal core board 11, namely, the locations of the through-bores 46, the type, grade or the like of the vehicle can be distinguished.

The through-bores 46 formed to divide the core plate 31 are used when necessary as shown in FIG. 13 during the steps for producing the metal core board 11 or the steps for assembling the metal core board 11 to the vehicle-mountable junction box 21. Namely, the contact part 61 is held in contact with the end surfaces of the core plate 31 exposed to the inner circumferential wall of each through-bore 46.

The contact part 61 may be formed by covering the inner circumferential wall of the through-bore 46 or may be a member engageable with the through-bore 46. Especially in the latte case, it is preferable that the contact part 61 is a part of the vehicle-mountable junction box 21 or a part of an element of the vehicle-mountable junction box 21.

To the inner circumferential wall of the through-bore 46, the end surfaces of the core plate 31 divided by the formation of the through-bore 46 are exposed. Therefore, the through-bore 46 has a force of gripping the member inserted through the through-bore 46 (gripping force) as compared with the case where the inner circumferential wall of the through-bore 46 is formed of only a resin. Thus, a strong holding state is provided.

FIG. 13 shows examples of the member engageable with the through-bore 46. FIG. 13A shows a pin member 62 having a pin-like shape as an example of the member engageable with the through-bore 46. The pin member 62 is formed to have an appropriate shape and is used for positioning or securing during the production steps or the assembly steps.

Figure 13A:
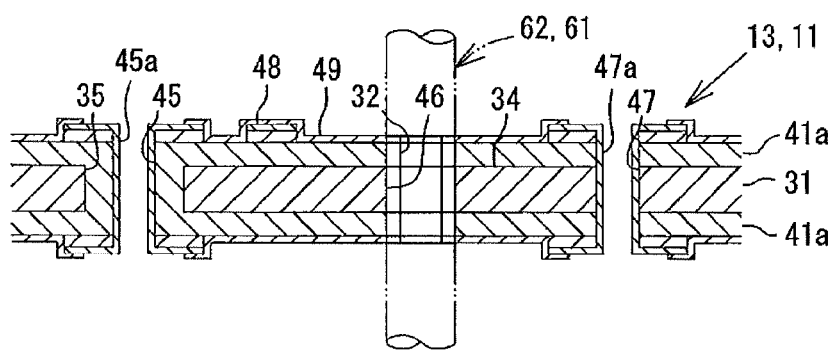
FIG. 13 provides cross-sectional views each showing a metal core board and a contact part.
Figure 13B:
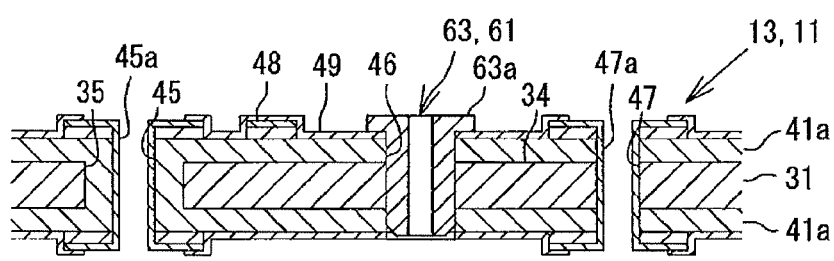

FIG. 13B shows a protective cap 63 for covering the end surfaces of the core plate 31 exposed to the through-bore 46. The protective cap 63 is formed to be cylindrical and includes a brim part 63a at an end thereof.

Figure 13C:
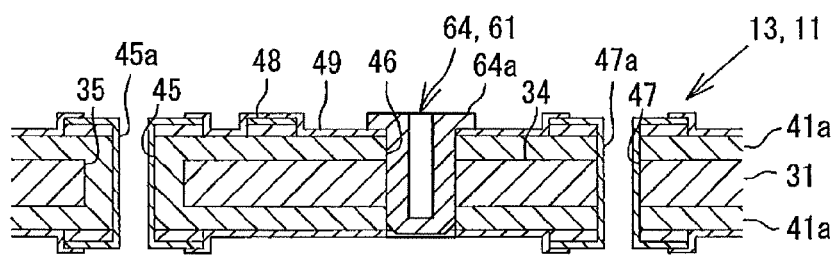

FIG. 13C shows a closing cap 64 for covering and protecting the end surfaces of the core plate 31 like the protective cap 63 and also positively closing the through-bore 46 completely. The closing cap 64 is formed to be hollow and includes a brim part 64a at an end thereof. Where the through-bore 46 is closed like this, even when the soldering is performed in a flow system, the solder can be prevented from sprouting.

The protective cap 63 or the closing cap 64 can improve the insulating property between the end surfaces of the core plate 31 exposed to the through-bore 46. Even when moisture is generated in the vicinity of the through-bore 46 due to dew condensation or the like, the risk that the moisture invades the through-bore 46 can be lowered and thus leaks can be prevented.

The protective cap 63 or the closing cap 64 may be solid. However, in the case where the protective cap 63 or the closing cap 64 is hollow, there are the following advantages. The inner space can be used for inserting the protective cap 63 or the closing cap 64 into the through-bore 46, and even when there is a size error in the through-bore 46, the protective cap 63 or the like, the protective cap 63 or the closing cap 64 can be deformable owing to being hollow and can reduce the load on the core plate 31.

Figure 13D:
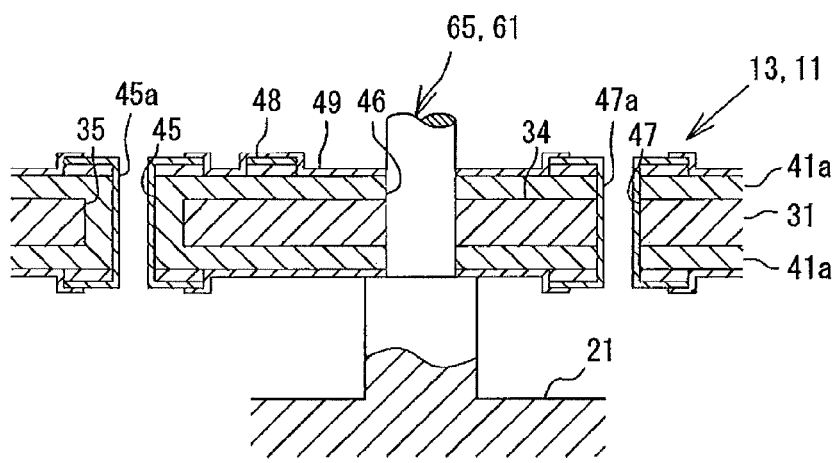

FIG. 13D shows a secured protrusion 65 formed on the vehicle-mountable junction box 21. The secured protrusion 65 may be, for example, formed as a part of the upper case 23 or the lower case 22 shown in FIG. 2, or apart of a terminal holder for holding a terminal which is a part of an element of the vehicle-mountable junction box 21 and provides an electrical connection with an external device. In the case where the metal core board 11 is assembled to the vehicle-mountable junction box 21 using the secured protrusion 65 as described above, substantially the same effect as that of the pin member 62 is provided on positioning or securing during the assembly, and also substantially the same effect of improving the insulating property as that of the protective cap 63 or the closing cap 64 is provided. The number of components can be decreased, which contributes to the size reduction.

The pin member, the protective cap 63, the closing cap 64 and the secured protrusion 65 are formed of an insulating material. For example, a rubber material containing a highly heat-transmissive material is a highly heat-transmissive insulating material and thus can provide heat transmission at the through-bore 46 with certainty and improve the heat radiation effect by heat uniformization.

The metal core board 11 also has the through-bores 47 having the plating layer 47a on the inner circumferential wall thereof (see FIGS. 3E and 3F) as described above. Namely, the through-bores 47 running through the core plate 31 in a thickness direction thereof are formed, and the plating layer 47a is formed on the inner circumferential wall of each through-bore 47 as a conductive part which is electrically connected to the core plate 31. The plating layer 47a is formed by non-electrolytic plating and electrolytic plating, like the through-bore plating material 45a.

The plating layer 47a is integral with the core plate 31 and therefore has a high adhering strength and a superb structure. Thus, when a connection terminal (not shown) is inserted into the through-bore 47, a good connection state can be provided with certainty.

Since the plating layer 47a is formed in each through-bore 47, the thick core plate 31 can be effectively used to improve the degree of freedom of using the metal core board 11. The metal core board 11 can be used for novel uses and can also fulfill high level of demands for the improvement of the mounting efficiency and the like.

As described above, the metal core board 11 using the core plate 31 includes the electrically independent islands 34. Therefore, the metal core board 11 can be reduced in size and improved in mounting efficiency. The metal core board 11 like this is optimum for a vehicle-mountable junction box 21 which is highly desired to have more functions and a certain size of space of a compartment.

Since the plating layer 47a is formed in each through-bore 47, which is formed at a position corresponding to the island 34, the thick core plate 31 can be effectively used to improve the degree of freedom of using the metal core board 11. The metal core board 11 can be used for novel uses and can also fulfill high level of demands for the improvement of the mounting efficiency and the like.

The size can be significantly reduced because the slits 32 are narrow and the through-bores 46 for dividing the core plate 31 can be small.

Even where the slits 32 are narrow, the core plate 31 can be suppressed from being warped or stressed owing to the arcked portions 36, the lengthy holes 37, and the bending portions 38. Therefore, the core plate 31 can be suppressed from being distorted even after being used for a long time and have improved durability. This effect is further improved because the stress is suppressed during the formation of the through-bores 46 for dividing the core plate 31.

Since the arcked portions 36 and the bending portions 38 of the slits 32 increase the planar strength of the core plate 31, a high level of ease of work is obtained for integrating the core plate 31 with the prepreg 41 and the like.

Since the arcked portions 36 and the bending portions of the slits 32 suppress the die 51 from being worn or damaged during the formation of the slits 32, a high level of ease of work is obtained with certainty. Thus, the cost for processing can be reduced.

The slits 32 are narrow. Therefore, when a part of the metal core board 11 is heated to a higher temperature than the other parts divided therefrom, the slits 32 first block the heat transmission to the surrounding areas immediately after the heat is generated but then gradually start transmitting the heat. Thus, the heat can be dispersed and uniformized. In this manner, the temperature difference is minimized in the entire metal core board 11, and the heat is collected to the core plate 31 and caused to radiate collectively. As a result, a good heat radiation effect is provided. An automobile is highly desired to have more functions and a certain size of space of a compartment. Especially from the viewpoint of providing a certain size of space of a compartment, the vehicle-mountable junction box 21 is occasionally mounted in a high-temperature engine room and thus is required to have a high heat radiation property. The metal core board 11 fulfills such a requirement.

In addition, when the contact parts 61 are held in the through-bores 46 for forming the islands 34, the contact parts 61 are, for example, inserted into the through-bores 46 with a strong coupling force. The end surfaces of the core plate 31 exposed to the through-bores 46 are protected by the contact parts 61. This can prevent leaks between divided core circuits or prevent unnecessary extra adhesion of the solder. When the through-bores 46 are used for, for example, positioning during the production steps or for securing during the assembly steps, the through-bores 46 can be effectively used. When the through-bores 46 are used for positioning, the processing precision of the corresponding step can be easily improved. As a result, a highly precise product can be produced. When the through-bores 46 are used for securing, the number of components can be decreased, which contributes to the size reduction, the improvement of the mounting efficiency and also the improvement of the efficiency of the assembling work.

The contact part 61 may be formed by molding or coating. However, when the pin member 62, the protective cap 63, the closing cap 64 or the secured protrusion 65 is used as the contact part 61, the cost can be reduced.

The member engageable with the through-bore according to the present invention corresponds to the pin member 62, the protective cap 63, the closing cap 64 or the secured protrusion 65 in the above-described embodiment; and in the same manner, the conductive part according to the present invention corresponds to the plating layer 47a.

However, the present invention is not limited to the above-described embodiment, and can be carried out in many other embodiments.

INDUSTRIAL APPLICABILITY

The metal core board according to the present invention can be reduced in size and improved in mounting efficiency with certainty and is applicable for a vehicle such as an electric automobile or the like which requires many circuits.

REFERENCE SIGNS LIST

11 . . . Metal core board
21 . . . Vehicle-mountable junction box
31 . . . Core plate
32 . . . Slit
33 . . . Separating connection part
34 . . . Island
36 . . . Arcked portion
37 . . . Lengthy hole
38 . . . Bending portion
46 . . . Through-hole
47 . . . Through-hole
47a . . . Plating layer
51 . . . Die
61 . . . Contact part
62 . . . Pin member
63 . . . Protective cap
64 . . . Closing cap
65 . . . Secured protrusion
W . . . Narrow width

The invention claimed is:
1. A metal core board for a vehicle-mountable junction box, which is mountable on the vehicle-mountable junction box, comprising:
a core plate forming an intermediate layer of the metal core board comprising an island, a plurality of slits that surround an entirety of the island, and separating connection parts present between the slits;

wherein the core plate is a first thickness;
wherein the separating connection parts are a second thickness;
wherein the plurality of slits are a third thickness that is more than twice the first thickness;
wherein the second thickness and the third thickness are substantially the same;
wherein the plurality of slits have shapes of bent and/or straight thready-lines; and
wherein, in the state where the island is held between insulating layers stacked on both of two surfaces of the core plate, the separating connection parts are removed and the island is made electrically independent from a remaining part of the core plate while being held between the insulating layers.

2. A metal core board for a vehicle-mountable junction box according to claim 1, wherein the separating connection parts are removed sequentially in accordance with shapes of the slits and the separating connection parts and locations of the separating connection parts.

3. A metal core board for a vehicle-mountable junction box according to claim 1, wherein a contact part is held in each of through-bores formed to remove the separating connection parts, the contact part being in contact with end surfaces of the core plate exposed to an inner circumferential wall of each of the through-bores.

4. A metal core board for a vehicle-mountable junction box according to claim 3, wherein the contact part is a member engageable with each of the through-bores.

5. A metal core board for a vehicle-mountable junction box according to claim 4, wherein the contact part is a part of the vehicle-mountable junction box or a part of an element of the vehicle-mountable junction box.

6. A metal core board for a vehicle-mountable junction box according to claim 1, wherein: the core plate has a through-bore running there through in a thickness thereof; and a conductive part electrically connected to the core plate is formed on an inner circumferential wall of the through-bore.

7. A metal core plate structure usable for a metal core board for a vehicle-mountable junction box, which is mountable on the vehicle-mountable junction box, the metal core plate structure comprising an island surrounded by a plurality of slits and separating connection parts present between the slits,
wherein the metal core plate structure is a first thickness,
wherein the separating connection parts are a second thickness,
wherein the plurality of slits are a third thickness that is more than twice the first thickness, and
wherein the second thickness and the third thickness are substantially the same.

8. A core plate structure usable for a metal core board for a vehicle-mountable junction box according to claim 7, wherein the slits each have an arcked portion at each of ends thereof.

9. A core plate structure usable for a metal core board for a vehicle-mountable junction box according to claim 7,
wherein the separating connection parts are held between lengthy holes which are longer than a width of parts of the slits, and
wherein, at the parts of the slits, inside walls of the slits are parallel to and face one another.

10. A core plate structure usable for a metal core board for a vehicle-mountable junction box according to claim 9, wherein the width of the slits is a width with which heat is transmitted between parts facing each other while sandwiching the slits.

11. A core plate structure usable for a metal core board for a vehicle-mountable junction box according to claim 7, wherein at least one of the slits includes a bending portion for changing a direction in which the slit extends.

12. A core plate structure usable for a metal core board for a vehicle-mountable junction box according to claim 11, wherein at least one of the slits includes a plurality of the bending portions.

13. A core plate structure usable for a metal core board for a vehicle-mountable junction box according to claim 11, wherein the bending portion is bent at an obtuse angle.

14. A core plate structure usable for a metal core board for a vehicle-mountable junction box according to claim 7, wherein at least one of the slits has a shape as seen in a plan view which includes a non-straight bending portion for strengthening a binding force of the core plate when the slit is formed by punching.

15. A metal core board for a vehicle-mountable junction box using a core plate structure according to claim 7.

16. A metal core board for a vehicle-mountable junction box, wherein: a core plate having a core plate structure according to claim 7 is used; and after insulating layers are formed on both of two surfaces of the core plate, the separating parts are removed and the island is made electrically independent.

* * * * *